United States Patent
Kim et al.

(10) Patent No.: US 10,210,804 B2
(45) Date of Patent: Feb. 19, 2019

(54) ORGANIC LIGHT EMITTING DIODE DISPLAY DEVICE

(71) Applicant: LG Display Co., Ltd., Seoul (KR)

(72) Inventors: Sung-Hun Kim, Iksan-si (KR); Eui-Hyun Chung, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/673,165

(22) Filed: Aug. 9, 2017

(65) Prior Publication Data
US 2018/0174511 A1   Jun. 21, 2018

(30) Foreign Application Priority Data
Dec. 21, 2016 (KR) .......................... 10-2016-0175739

(51) Int. Cl.
| | |
|---|---|
| *G09G 3/3233* | (2016.01) |
| *G09G 3/20* | (2006.01) |
| *G02F 1/1343* | (2006.01) |
| *G09G 3/3225* | (2016.01) |
| *H01L 27/32* | (2006.01) |

(52) U.S. Cl.
CPC ......... *G09G 3/3233* (2013.01); *G02F 1/1343* (2013.01); *G09G 3/2003* (2013.01); *G09G 3/2074* (2013.01); *G09G 3/3225* (2013.01); *H01L 27/3216* (2013.01); *H01L 27/3218* (2013.01); *G09G 2300/0426* (2013.01); *G09G 2300/0452* (2013.01); *G09G 2330/021* (2013.01); *G09G 2330/025* (2013.01)

(58) Field of Classification Search
CPC .......... G02F 1/1343; G09G 2300/0452; G09G 2330/021; G09G 3/2003; G09G 3/2074; G09G 3/3233

USPC .................................................. 345/204, 212
See application file for complete search history.

(56) References Cited

U.S. PATENT DOCUMENTS

| | | | | |
|---|---|---|---|---|
| 8,421,820 B2* | 4/2013 | Brown Elliott | .......... | G09G 3/20 345/204 |
| 2013/0235020 A1* | 9/2013 | Kim | ..................... | G09G 3/3648 345/212 |
| 2014/0320464 A1* | 10/2014 | Ryu | ..................... | G09G 3/3688 345/204 |

(Continued)

FOREIGN PATENT DOCUMENTS

| | | | |
|---|---|---|---|
| EP | 0 158 366 A2 | 10/1985 | |
| EP | 0493178 A1 * | 7/1992 | ....... G02F 1/133514 |

(Continued)

OTHER PUBLICATIONS

European Patent Office, Extended European Search Report and Opinion, EP Patent Application No. 17208721.5, dated Apr. 5, 2018, nine pages.

*Primary Examiner* — Tony O Davis
(74) *Attorney, Agent, or Firm* — Fenwick & West LLP (57) ABSTRACT

An organic light emitting diode (OLED) display device for supplying a data signal to a pentile pixel array to reduce power consumption is disclosed. A plurality of the same color of sub pixels that are disposed in different pixel columns and different pixel rows in a pentile pixel array have pixel structures that are right and left inverted based on the same data line and share the same data line, and thus, a data driver supplies the same color of data signals for each data line.

6 Claims, 5 Drawing Sheets

(56) References Cited

U.S. PATENT DOCUMENTS

| | | | | |
|---|---|---|---|---|
| 2015/0316825 A1* | 11/2015 | Lim | ............... | G02F 1/136286 |
| | | | | 257/72 |
| 2016/0155983 A1* | 6/2016 | Lee | ............... | H01L 51/5209 |
| | | | | 257/40 |
| 2016/0233234 A1* | 8/2016 | Yang | ............... | G02F 1/136286 |
| 2016/0240594 A1* | 8/2016 | Zhu | ............... | H01L 27/3218 |
| 2017/0018219 A1* | 1/2017 | Wang | ............... | G09G 3/2092 |
| 2017/0025053 A1* | 1/2017 | Broughton | ............... | G09G 3/2003 |
| 2017/0195658 A1* | 7/2017 | Jung | ............... | H04N 13/00 |

FOREIGN PATENT DOCUMENTS

| | | | | |
|---|---|---|---|---|
| EP | 2139040 A1 * | 12/2009 | ............... | H01L 27/283 |
| WO | WO 2016/107188 A1 | 7/2016 | | |
| WO | WO 2016107188 A1 * | 7/2016 | ............... | H01L 51/0011 |

\* cited by examiner

[Data Current]
PEAK CURRENT BASED ON 4 PIXELS

[Data Voltage]
ALTERNATING FORM OF BLUE DATA AND RED DATA

ORGANIC LIGHT EMITTING DIODE DISPLAY DEVICE

CROSS REFERENCE TO RELATED APPLICATION

This application claims the benefit of Korean Patent Application No. 10-2016-0175739, filed on Dec. 21, 2016, which is hereby incorporated by reference as if fully set forth herein.

BACKGROUND OF THE INVENTION

Field of the Invention

The present invention relates to an organic light emitting diode display device for effectively supplying a data signal to a pentile pixel array and reducing power consumption.

Discussion of the Related Art

Representative examples of an image display device include a liquid crystal display (LCD), an organic light emitting diode (OLED) display device, and so on.

The OLED display device is configured in such a way that many pixel structures are formed by configuring red, green, and blue sub pixels in various shapes and arrangements using a self-emissive OLED element. Thereamong, as shown in FIG. 1, a diamond pentile pixel arrangement structure in which red, green, and blue sub pixels R, G, and B are arranged in a diamond shape is known as having excellent perceptual quality.

Figure 1:
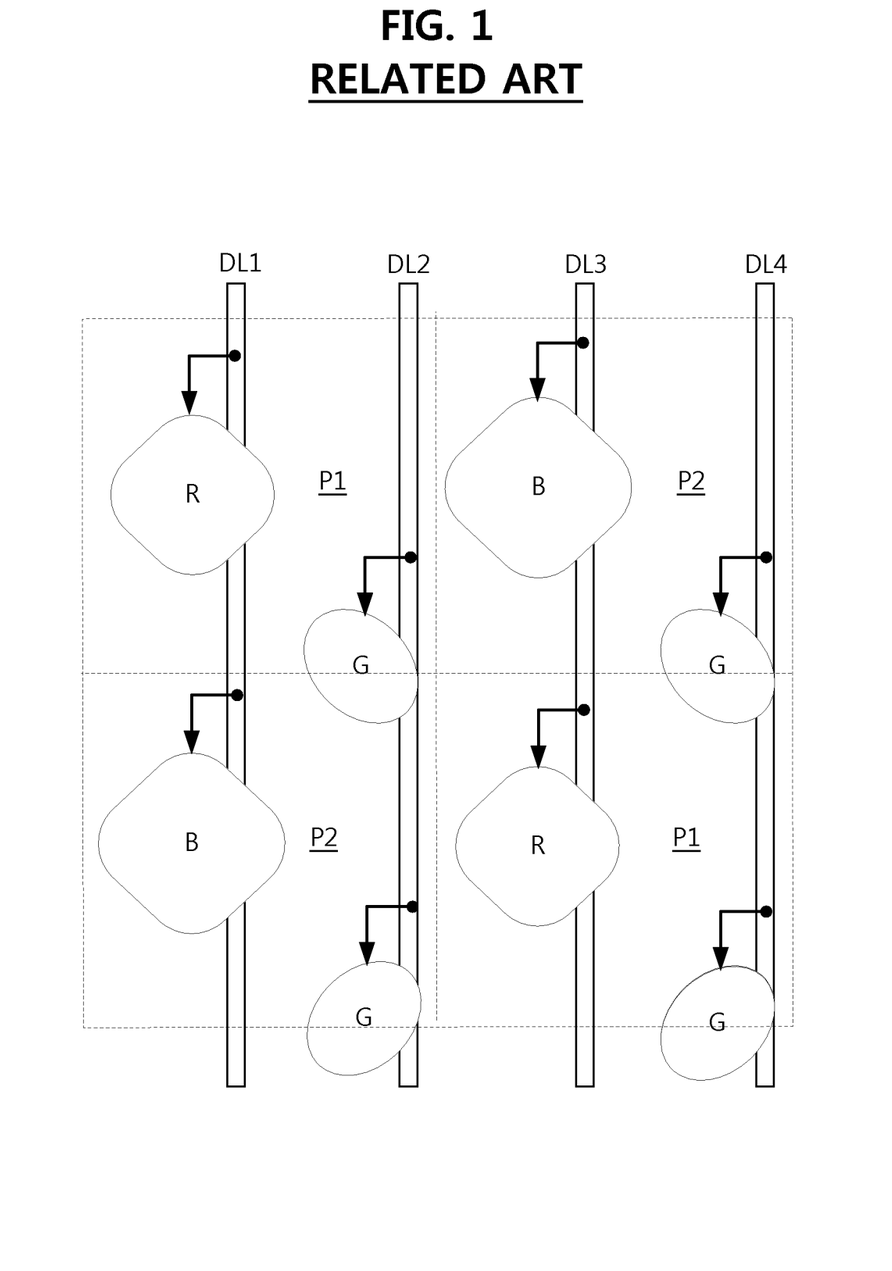
FIG. 1 is a diagram illustrating a diamond pentile pixel arrangement structure of the related art.

Referring to FIG. 1, a pentile pixel structure of the related art may be configured in such a way that a first pixel P1 having green G and red R sub pixels and a second pixel P2 having green G and blue B sub pixels are alternately arranged in horizontal and vertical directions.

A second data line DL2 shared by G sub pixels of a second pixel column and a fourth data line DL4 shared by G sub pixels of a fourth pixel column may supply a G data signal for each scan period.

Figure 2:
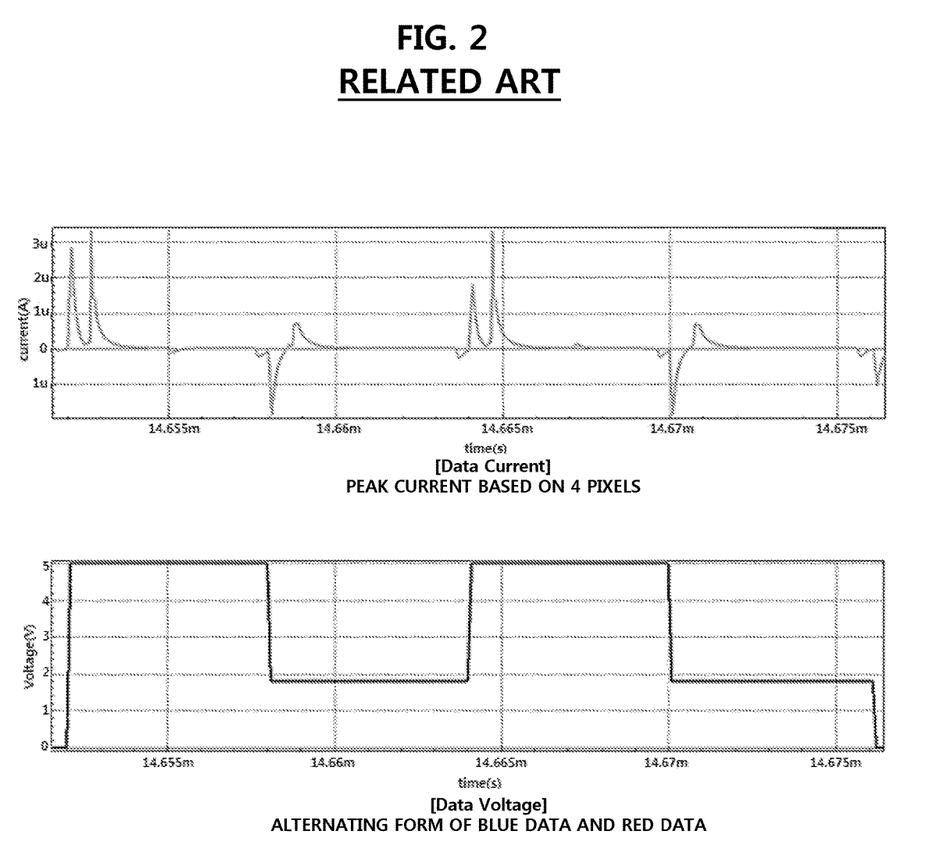
FIG. 2 is a waveform diagram of R and B data signals supplied to a data line shown in FIG. 1.

However, a first data line DL1 shared by R and B sub pixels that are alternately arranged in a first pixel column alternately supplies R and B data signals at different voltage levels for respective scan periods, as shown in FIG. 2. A third data line DL3 shared by B and R sub pixels that are alternately arranged in a third pixel column alternately supplies B and R data signals at different voltage levels for respective scan periods.

As such, data lines DL1 and DL3 shared by R and B sub pixels with different color supply voltages at different levels for a respective scan period. Accordingly, peak current is increased whenever a voltage level of a data signal is varied as shown in FIG. 2 and, thus, power consumption is disadvantageously increased.

SUMMARY OF THE INVENTION

Accordingly, the present invention is directed to an organic light emitting diode (OLED) display device that substantially obviates one or more problems due to limitations and disadvantages of the related art.

An object of the present invention is to provide an organic light emitting diode (OLED) display device for effectively supplying a data signal to a pentile pixel array to reduce power consumption.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting diode (OLED) display device includes a $(1\text{-}1)^{th}$ sub pixel configured to display first color in a first pixel row and a first pixel column and overlapping a first data line and a $(1\text{-}1)^{th}$ pixel circuit configured to drive the $(1\text{-}1)^{th}$ sub pixel, a $(1\text{-}2)^{th}$ sub pixel configured to display second color in a first pixel row and a second pixel column and overlapping a second data line and a $(1\text{-}2)^{th}$ pixel circuit configured to drive the $(1\text{-}2)^{th}$ sub pixel, and a $(1\text{-}3)^{th}$ sub pixel configured to display third color in a first pixel row and a third pixel column and overlapping a third data line and a $(1\text{-}3)^{th}$ pixel circuit configured to drive the $(1\text{-}3)^{th}$ sub pixel.

The OLED display device may include a $(2\text{-}1)^{th}$ sub pixel configured to display the second color in the second pixel row and the second pixel column and overlapping the second data line and a $(2\text{-}1)^{th}$ pixel circuit configured to drive the $(2\text{-}1)^{th}$ sub pixel, a $(2\text{-}2)^{th}$ sub pixel configured to display the first color in the second pixel row and the third pixel column and overlapping the third data line and a $(2\text{-}2)^{th}$ pixel circuit configured to drive the $(2\text{-}2)^{th}$ sub pixel, a $(2\text{-}3)^{th}$ sub pixel configured to display the second color in the second pixel row and the fourth pixel column and overlapping a fourth data line and a $(2\text{-}3)^{th}$ pixel circuit configured to drive the $(2\text{-}3)^{th}$ sub pixel, and a $(2\text{-}4)^{th}$ sub pixel configured to display the third color in the second pixel row and a fifth pixel column and overlapping a fifth data line and a $(2\text{-}4)^{th}$ pixel circuit configured to drive the $(2\text{-}4)^{th}$ sub pixel.

The $(1\text{-}1)^{th}$ sub pixel and the $(1\text{-}1)^{th}$ pixel circuit, and the $(2\text{-}2)^{th}$ sub pixel and the $(2\text{-}2)^{th}$ pixel circuit may share the second data line and have pixel arrangement structures that are right and left inverted based on the second data line.

The $(1\text{-}2)^{th}$ sub pixel and the $(1\text{-}2)^{th}$ pixel circuit, and the $(2\text{-}3)^{th}$ sub pixel and the $(2\text{-}3)^{th}$ pixel circuit may share the third data line and have pixel arrangement structures that are right and left inverted based on the third data line.

The $(1\text{-}3)^{th}$ sub pixel and the $(1\text{-}3)^{th}$ pixel circuit, and the $(2\text{-}4)^{th}$ sub pixel and the $(2\text{-}4)^{th}$ pixel circuit may share the fourth data line and have pixel arrangement structures that are right and left inverted based on the fourth data line.

The first and third data lines may supply a data signal of the second color, the second data line may supply a data signal of the first color, and the fourth data line may supply a data signal of the third color.

The $(1\text{-}1)^{th}$ pixel circuit connected to the second data line and the $(2\text{-}1)^{th}$ pixel circuit connected to the first data line may be disposed between the first and second data lines. The $(1\text{-}2)^{th}$ pixel circuit connected to the third data line and the $(2\text{-}2)^{th}$ pixel circuit connected to the second data line may be disposed between the second and third data lines. The $(1\text{-}3)^{th}$ pixel circuit connected to the fourth data line and the $(2\text{-}3)^{th}$ pixel circuit connected to the third data line may be disposed between the third and fourth data lines.

The $(1\text{-}1)^{th}$ sub pixel and the $(1\text{-}3)^{th}$ sub pixel may be disposed on an upper portion of the first pixel row. The $(1\text{-}2)^{th}$ sub pixel and a $(1\text{-}4)^{th}$ sub pixel may be disposed on a lower portion of the first pixel row. The $(2\text{-}2)^{th}$ sub pixel and the (2-4)$^{th}$ sub pixel may be disposed on an upper portion of the second pixel row. The (2-1)$^{th}$ sub pixel and the (2-3)$^{th}$ sub pixel may be disposed on a lower portion of the second pixel row.

A data driver may supply the same color of data signals for each data line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the preferred embodiments of the present invention, examples of which are illustrated in the accompanying drawings.

Figure 3:
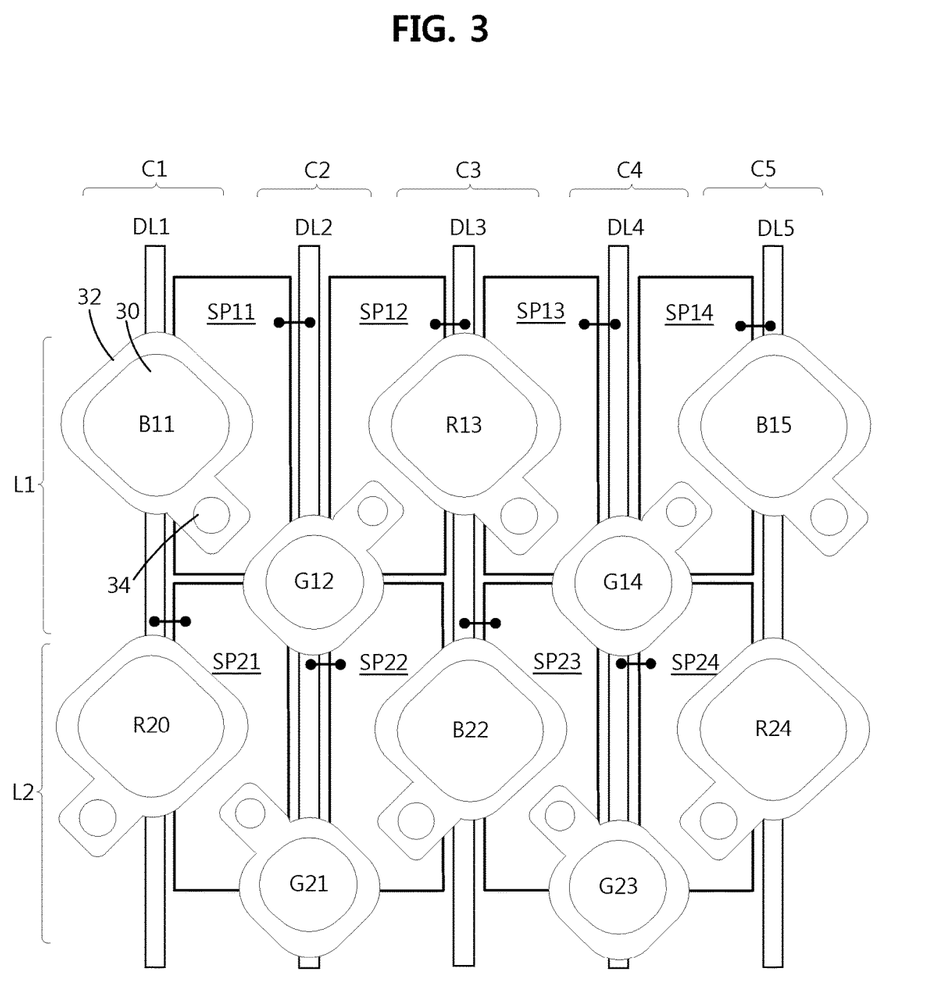
FIG. 3 is a schematic diagram illustrating a pixel arrangement structure of an organic light emitting diode (OLED) display device according to an embodiment of the present invention.

FIG. 3 is a schematic diagram illustrating a pixel arrangement structure of an organic light emitting diode (OLED) display device according to an embodiment of the present invention.

Referring to FIG. 3, the OLED display device according to an embodiment of the present invention may has a diamond pentile pixel arrangement structure configured in such a way that red R, green G, and blue B sub pixel are arranged in a diamond pattern shape. A first basic pixel may include an R sub pixel and a G sub pixel and a second basic pixel may include a B sub pixel and a G sub pixel. A G sub pixel included in each basic pixel may have a smaller size than R and B sub pixels in consideration of brightness, color temperature, and so on.

Each of the R, G, and B sub pixels may refer to an OLED element 30 that emits R, G, and B light respectively. A shape of each sub pixel may be determined to correspond to a shape of a light emitting portion of the OLED element 30 that emits color light through an opening such as a black matrix. The OLED element 30 may be driven by a pixel circuit SPnm (n and m are each a natural number) to which an anode 32 of the OLED element 30 is connected through a contact portion 34.

A first pixel column C1 may include a B11 sub pixel of a first pixel row L1 and an R20 sub pixel of a second pixel row L2 that overlap the first data line DL1 and are arranged in a direction of the first data line DL1. A second pixel column C2 may include a G12 sub pixel of the first pixel row L1 and a G21 sub pixel of the second pixel row L2 that overlap the second data line DL2 and are arranged in a direction of the second data line DL2. A third pixel column C3 may include an R13 sub pixel of the first pixel row L1 and a B22 sub pixel of the second pixel row L2 that overlap the third data line DL3 and are arranged in a direction of the third data line DL3. A fourth pixel column C4 may include a G14 sub pixel of the first pixel row L1 and a G23 sub pixel of the second pixel row L2 that overlap the fourth data line DL4 and are arranged in a direction of the fourth data line DL4. A fifth pixel column C5 may include a B15 sub pixel of the first pixel row L1 and an R24 sub pixel of the second pixel row L2 that overlap the fifth data line DL5 and are arranged in a direction of the fifth data line DL5.

B11, G12, R13, G14, and B15 sub pixels may be arranged in the first pixel row L1. R20, G21, B22, G23, and R24 sub pixels may be arranged in the second pixel row L2.

The first data line DL1 may be connected to a 21$^{st}$ pixel circuit SP21 for driving the G21 sub pixel that belongs to the second pixel row L2 and the second pixel column C2 and may supply a G data signal.

The second data line DL2 may be connected to a 11$^{th}$ pixel circuit SP11 for driving the B11 sub pixel that belongs to the first pixel row L1 and the first pixel column C1 and may be connected to a 22$^{nd}$ pixel circuit SP22 for driving a B22 sub pixel that belongs to the second pixel row L2 and the third pixel column C3 to supply only a B data signal. Based on the second data line DL2, the B11 sub pixel and the 11$^{th}$ pixel circuit SP11 for driving the same, which are positioned at an upper-left end portion, and the B22 sub pixel and the 22$^{nd}$ pixel circuit SP22 for driving the same, which are positioned at a lower-right end portion, may have pixel arrangement structures that are right and left inverted based on the second data line DL2 and share the second data line DL2.

The third data line DL3 may be connected to a 12$^{th}$ pixel circuit SP12 for driving the G12 sub pixel that belong to the first pixel row L1 and the second pixel column C2 and connected to a 23$^{rd}$ pixel circuit SP23 for driving the G23 sub pixel that belongs to the second pixel row L2 and the fourth pixel column C4 to supply only a G data signal. Based on the third data line DL3, the G12 sub pixel and the 12$^{th}$ pixel circuit SP12 for driving the same, which are positioned at an upper-left end portion, and the G23 sub pixel and the 23$^{rd}$ pixel circuit SP23 for driving the same, which are positioned at a lower-right end portion, may have pixel arrangement structures that are right and left inverted based on the third data line DL3 and share the third data line DL3.

The fourth data line DL4 may be connected to a 13$^{th}$ pixel circuit SP13 for driving the R13 sub pixel that belongs to the first pixel row L1 and the third pixel column C3 and connected to a 24$^{th}$ pixel circuit SP24 for driving the R24 sub pixel that belongs to the second pixel row L2 and a fifth pixel column C5 to supply only an R data signal. Based on the fourth data line DL4, the R13 sub pixel and the 13$^{th}$ pixel circuit SP13 for driving the same, which are positioned at an upper-left end portion, and the R24 sub pixel and the 24$^{th}$ pixel circuit SP24 for driving the same, which are positioned at a lower-right end portion, may have pixel arrangement structures that are right and left inverted based on the fourth data line DL4 and share the fourth data line DL4.

The 11$^{th}$ pixel circuit SP11 connected to the second data line DL2 and the 21$^{st}$ pixel circuit SP21 connected to the first data line DL1 may be disposed between the first and second data lines DL1 and DL2.

The 12$^{th}$ pixel circuit SP12 connected to the third data line DL3 and the 22$^{nd}$ pixel circuit SP22 connected to the second data line DL2 may be disposed between the second and third data lines DL2 and DL3.

The 13$^{th}$ pixel circuit SP13 connected to the fourth data line DL4 and the 23$^{rd}$ pixel circuit SP23 connected to the third data line DL3 may be disposed between the third and fourth data lines DL3 and DL4.

A 14$^{th}$ pixel circuit SP14 connected to a fifth data line DL5 and the 24$^{th}$ pixel circuit SP24 connected to the fourth data line DL4 may be disposed between the fourth and fifth data lines DL4 and DL5.

As shown in FIG. 3, the sub pixels B11, R13 and B15 may be disposed on an upper portion of the first pixel row L1, the sub pixels G12 and G14 may be disposed on a lower portion of the first pixel row; the sub pixels R20, B22 and R24 may be disposed on an upper portion of the second pixel row L2, the sub pixels G21 and G23 may be disposed on a lower portion of the second pixel row L2.

As such, a plurality of sub pixels and pixel circuits with the same color, which are disposed in different pixel columns and different pixel rows, have pixel arrangement structures that are right and left inverted based on the same data line and share the same data line and, thus, each data line may supply data signals with the same color, thereby reducing peak current and power consumption.

Figure 4:
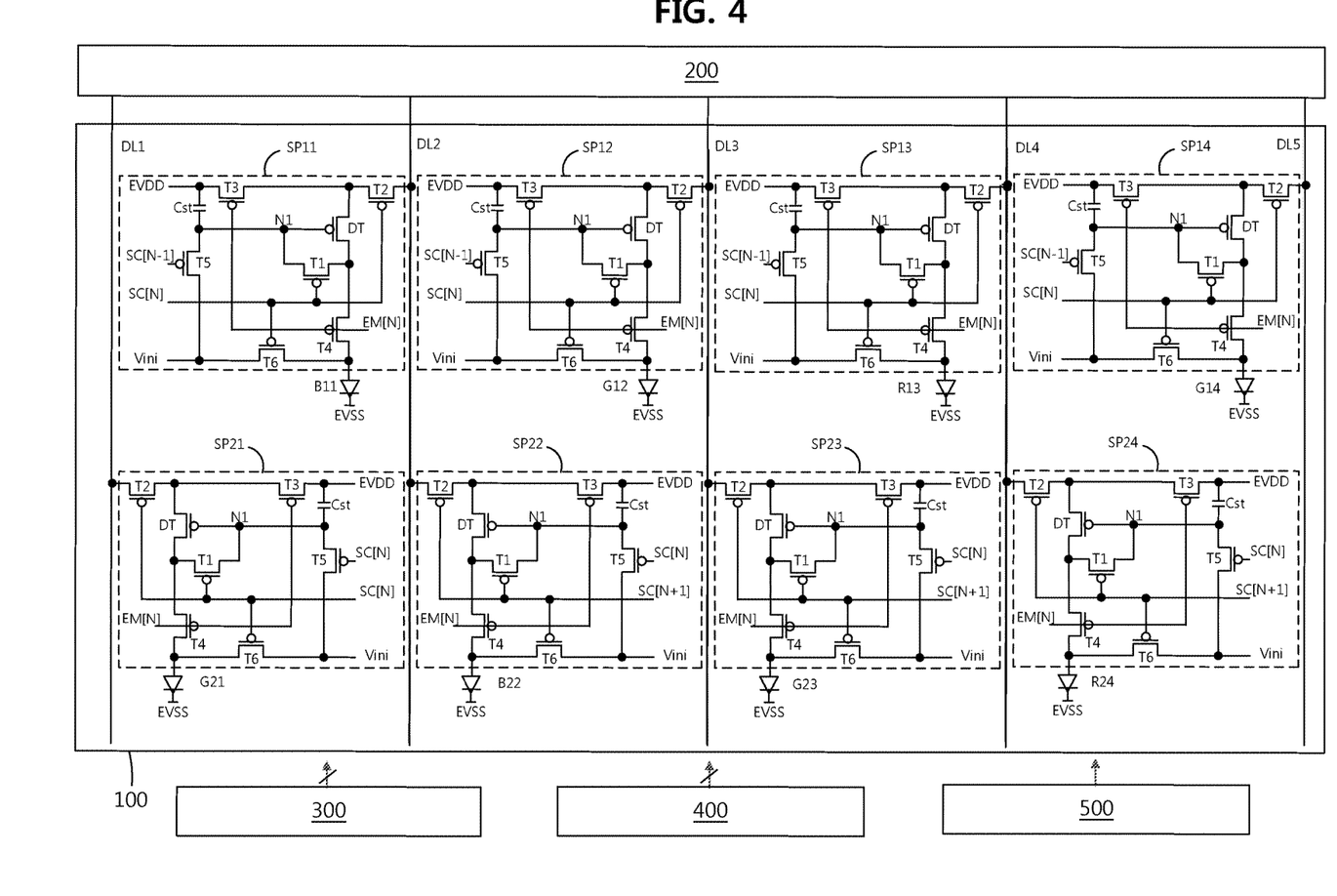
FIG. 4 is a diagram showing a structure of an OLED display device according to an embodiment of the present invention.

FIG. 4 is a diagram showing a structure of an OLED display device according to an embodiment of the present invention.

Referring to FIG. 4, the OLED display device according to an embodiment of the present invention may include a display panel 100, a data driver 200, a scan driver 300, a light emitting control driver 400, a power supply 500, and so on.

The data driver 200 may respectively supply data signals with the same color to the data lines DL1 to DL5 of the display panel 100. For example, a G data signal may be supplied to the first data line DL1, a B data signal may be supplied to the second data line DL2, a G data signal may be supplied to the third data line DL3, and an R data signal may be supplied to the fourth data line DL4.

The scan driver 300 may sequentially drive scan lines SC[N−1], SC[N], and SC [N+1] of the display panel 100.

The light emitting control driver 400 may drive light emitting control lines EM[N] of the display panel 100.

The power supply 500 may generate and supply power supply voltages EVDD, EVSS, and Vini required for driving the display panel 100.

The display panel 100 may have a pentile pixel arrangement structure shown in FIG. 3.

The first data line DL1 may be connected to the 21$^{st}$ pixel circuit SP21 for driving an OLED element of a G21 sub pixel and may supply a G data signal.

The second data line DL2 may be connected to the 11$^{th}$ pixel circuit SP11 for driving an OLED element of a B11 sub pixel and connected to the 22$^{nd}$ pixel circuit SP22 for driving an OLED of a B22 sub pixel to supply only a B data signal. The 11$^{th}$ pixel circuit SP11 and the 22$^{nd}$ pixel circuit SP22 may have pixel arrangement structures that are right and left inverted based on the second data line DL2 and share the second data line DL2.

The third data line DL3 may be connected to the 12$^{th}$ pixel circuit SP12 for driving an OLED element of a G12 sub pixel and connected to the 23$^{rd}$ pixel circuit SP23 for driving an OLED element of a G23 sub pixel to supply only a G data signal. The 12$^{th}$ pixel circuit SP12 and the 23$^{rd}$ pixel circuit SP23 may have pixel arrangement structures that are right and left inverted based on the third data line DL3 and share the third data line DL3.

The fourth data line DL4 may be connected to the 13$^{th}$ pixel circuit SP13 for driving an OLED of an R13 sub pixel and connected to the 24$^{th}$ pixel circuit SP24 for driving an OLED element of an R24 sub pixel to supply only an R data signal. The 13$^{th}$ pixel circuit SP13 and the 24$^{th}$ pixel circuit SP24 may have pixel arrangement structures that are right and left inverted based on the fourth data line DL4 and share the fourth data line DL4.

Each pixel circuit SP may include first to sixth transistors T1 to T6, a driving transistor DT, and a storage capacitor Cst and may independently drive an OLED element. The transistors T1 to T6 and DT of the pixel circuit SP may each be configured as a P-channel or N-channel type thin film transistor TFT. FIG. 4 illustrates an example in which the transistors DT and T1 to T6 are each configured as a P-channel type TFT.

A pixel circuit SP of an N$^{th}$ pixel row may be connected to an (N−1)$^{th}$ scan line SC[N−1], an N$^{th}$ scan line SC[N], and an N$^{th}$ light emitting control line EM [N] and a pixel circuit SP of an (N+1)$^{th}$ pixel row may be connected to the N$^{th}$ scan line SC[N], the (N+1)$^{th}$ scan line SC[N+1], and the N$^{th}$ light emitting control line EM[N].

Hereinafter, any one of pixel circuits SP of an N$^{th}$ pixel row and a detailed structure thereof will be described.

An OLED element driven by the pixel circuit SP may include an anode connected to the driving TFT DT, a cathode connected to a low voltage supply voltage EVSS, and a light emitting layer between the anode and the cathode and emit light in proportion to the amount of current supplied from the driving TFT DT.

A first electrode of the storage capacitor Cst may be connected to a line for supplying a first supply voltage EVDD and a second electrode may be connected to a first node N1 connected to a gate electrode of the driving transistor DT so as to be charged with a driving voltage Vgs of the driving transistor DT.

The driving transistor DT may control current for driving an OLED element depending on the driving voltage Vgs stored in the storage capacitor Cst.

The first transistor T1 may be controlled by the N$^{th}$ scan line SC[N] and, during a sampling period, may connect a drain electrode and a gate electrode of the driving transistor DT to connect the driving transistor DT to a diode structure.

The second transistor T2 may be controlled by the N$^{th}$ scan line SC[N] and, during a sampling period, may supply a data voltage Vdata of a data line DL to a source electrode of the driving transistor DT.

The third transistor T3 may be controlled by the N$^{th}$ light emitting control line EM[N] and, during a light-emitting period, may supply the first supply voltage EVDD to a source electrode of the driving transistor DT.

The fourth transistor T4 may be controlled by the N$^{th}$ light emitting control line EM[N] and, during a light-emitting period after a sampling period, may supply driving current supplied from the driving transistor DT to an OLED element.

The fifth transistor T5 may be controlled by the (N−1)$^{th}$ scan line SC[N−1] and, during an initialization period prior to a sampling period, may initialize the first node N1 connected to a gate electrode of the driving transistor DT and the storage capacitor Cst to an initialization voltage Vini.

The sixth transistor T6 may be controlled by the N$^{th}$ scan line SC[N] and, during a sampling period, may initialize an anode of an OLED element to the initialization voltage Vini.

During an initialization period, in response to a scan signal of the (N−1)$^{th}$ scan line SC[N−1], the fifth transistor T5 may be turned on and may initialize the first node N1 to the initialization voltage Vini. During an initialization period, the first to fourth transistors T1 to T4 of an N$^{th}$ pixel P[N] and the driving transistor DT may be turned off.

Then, during a sampling period, in response to a scan signal of the N$^{th}$ scan line SC [N], the first and second transistors T1 and T2 may be turned on and the sixth transistor T6 may be turned on. During a sampling period, the second transistor T2 may supply the data voltage Vdata of the data line DL to a source electrode of the driving transistor DT and the first transistor T1 may connect a drain electrode and a gate electrode of the driving transistor DT such that the driving transistor DT operates as a diode structure. The threshold voltage Vth of the driving transistor DT may be compensated for via an operation of a diode of the driving transistor DT and, thus, a data voltage Vdata−Vth obtained by compensating for Vth may be supplied to a gate electrode of the driving transistor DT. Accordingly, the storage capacitor Cst may be charged with a driving voltage Vgs=EVDD−Vdata+Vth to which the data voltage Vdata−Vth obtained by compensating for Vth is applied and may supply the driving voltage Vgs=EVDD−Vdata+Vth to the driving transistor DT during a next light emitting period. During a sampling period, the sixth transistor T6 may initialize an anode of an OLED element to the initialization voltage Vini. During the sampling period, the third to fifth transistors T3 to T5 may be turned off.

During a light emitting period, in response to a light emitting control signal of the N$^{th}$ light emitting control line EM[N], the third and fourth transistors T3 and T4 may be turned on. During a light emitting period, the third transistor T3 may supply the first supply voltage EVDD of a first power line to the source electrode of the driving transistor DT and the fourth transistor T4 may supply driving current supplied from the driving transistor DT to an OLED element such that an OLED element emits light. In this case, the driving transistor DT may supply driving current Ioled to an OLED element using a driving voltage Vgs=EVDD−Vdata+Vth stored in the storage capacitor Cst. The driving current Ioled of the OLED element may be determined according to "EVDD−Vdata" by offsetting a component Vth of the driving transistor DT according to Equation 1 below. In Equation 1 below, k is a proportional coefficient including mobility of the driving transistor DT and a component of channel width W/length L.

$$Ioled = k(Vgs-Vth)^2 = k\{(EVDD-Vdata+Vth)-Vth\}^2 = k(EVDD-Vdata)^2 \quad \text{[Equation 1]}$$

Figure 5:
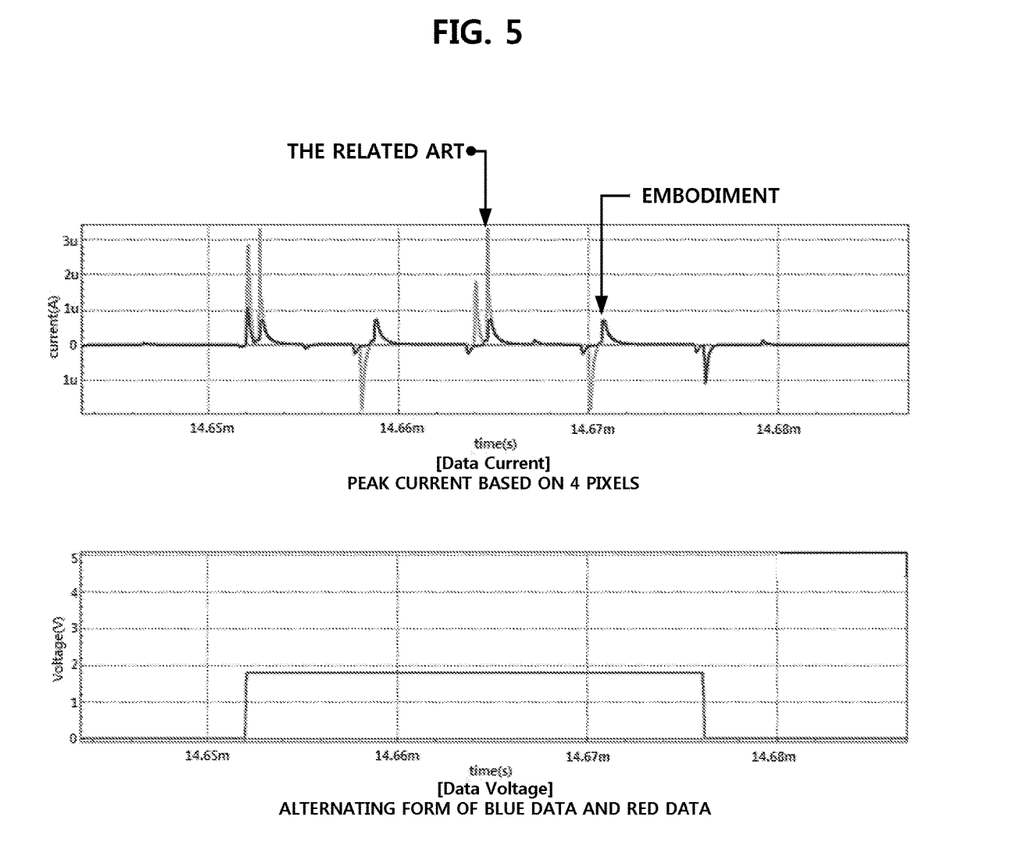
FIG. 5 is a diagram illustrating same color of data signals supplied to any one of data lines according to an embodiment of the present invention.

FIG. 5 is a diagram illustrating same color of data signals supplied to any one of data lines according to an embodiment of the present invention.

As seen from FIG. 5, according to an embodiment of the present invention, each data line may supply the same color of data signals and, thus, data voltage and peak current may be reduced compared with the related art in which different color of data signals are supplied, thereby reducing power consumption.

According to an embodiment of the present invention, an OLED display device may be configured in such a way that a plurality of the same color of sub pixels that are arranged in different pixel columns and different pixel rows in a pentile pixel array may have pixel structures that are right and left inverted based on the same data line and share the same data line and, thus, a data driver may supply the same color of data signals for each data line. Accordingly, compared with the related art in which different color of data signals are supplied to respective data lines, variation amplitude of a voltage level of the same color of data signals supplied to each data line may be reduced, thereby reducing peak current and power consumption.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode (OLED) display device comprising:
   a (1-1)$^{th}$ sub pixel configured to display first color in a first pixel row and a first pixel column and overlapping a first data line and a (1-1)$^{th}$ pixel circuit configured to drive the (1-1)$^{th}$ sub pixel;
   a (1-2)$^{th}$ sub pixel configured to display second color in the first pixel row and a second pixel column and overlapping a second data line and a (1-2)$^{th}$ pixel circuit configured to drive the (1-2)$^{th}$ sub pixel;
   a (1-3)$^{th}$ sub pixel configured to display third color in the first pixel row and a third pixel column and overlapping a third data line and a (1-3)$^{th}$ pixel circuit configured to drive the (1-3)$^{th}$ sub pixel;
   a (2-1)$^{th}$ sub pixel configured to display the second color in a second pixel row and the second pixel column and overlapping the second data line and a (2-1)$^{th}$ pixel circuit configured to drive the (2-1)$^{th}$ sub pixel;
   a (2-2)$^{th}$ sub pixel configured to display the first color in the second pixel row and the third pixel column and overlapping the third data line and a (2-2)$^{th}$ pixel circuit configured to drive the (2-2)$^{th}$ sub pixel;
   a (2-3)$^{th}$ sub pixel configured to display the second color in the second pixel row and a fourth pixel column and overlapping a fourth data line and a (2-3)$^{th}$ pixel circuit configured to drive the (2-3)$^{th}$ sub pixel; and
   a (2-4)$^{th}$ sub pixel configured to display the third color in the second pixel row and a fifth pixel column and overlapping a fifth data line and a (2-4)$^{th}$ pixel circuit configured to drive the (2-4)$^{th}$ sub pixel,
   wherein the (1-1)$^{th}$ sub pixel and the (1-1)$^{th}$ pixel circuit, and the (2-2)$^{th}$ sub pixel and the (2-2)$^{th}$ pixel circuit share the second data line and have pixel arrangement structures that are right and left inverted based on the second data line;
   wherein the (1-2)$^{th}$ sub pixel and the (1-2)$^{th}$ pixel circuit, and the (2-3)$^{th}$ sub pixel and the (2-3)$^{th}$ pixel circuit share the third data line and have pixel arrangement structures that are right and left inverted based on the third data line; and
   wherein the (1-3)$^{th}$ sub pixel and the (1-3)$^{th}$ pixel circuit, and the (2-4)$^{th}$ sub pixel and the (2-4)$^{th}$ pixel circuit share the fourth data line and have pixel arrangement structures that are right and left inverted based on the fourth data line.

2. The OLED display device of claim 1, wherein the first data line and the third data line supply corresponding data signals of the second color;
   wherein the second data line supplies a data signal of the first color; and wherein the fourth data line supplies a data signal of the third color.

3. The OLED display device of claim 1, wherein the $(1-1)^{th}$ pixel circuit connected to the second data line and the $(2-1)^{th}$ pixel circuit connected to the first data line are disposed between the first data line and the second data line;
wherein the $(1-2)^{th}$ pixel circuit connected to the third data line and the $(2-2)^{th}$ pixel circuit connected to the second data line are disposed between the second data line and the third data line; and
wherein the $(1-3)^{th}$ pixel circuit connected to the fourth data line and the $(2-3)^{th}$ pixel circuit connected to the third data line are disposed between the third data line and the fourth data line.

4. The OLED display device of claim 3, wherein the $(1-1)^{th}$ sub pixel and the $(1-3)^{th}$ sub pixel are disposed on an upper portion of the first pixel row;
wherein the $(1-2)^{th}$ sub pixel and a $(1-4)^{th}$ sub pixel are disposed on a lower portion of the first pixel row;
wherein the $(2-2)^{th}$ sub pixel and the $(2-4)^{th}$ sub pixel are disposed on an upper portion of the second pixel row; and
wherein the $(2-1)^{th}$ sub pixel and the $(2-3)^{th}$ sub pixel are disposed on a lower portion of the second pixel row.

5. The OLED display device of claim 1, wherein a data driver configured to drive the first data line, the second data line, the third data line, and the fourth data line supplies a same color of data signals for each data line.

6. The OLED display device of claim 1, wherein the $(1-1)^{th}$ pixel circuit is connected to the second data line;
wherein the $(1-2)^{th}$ pixel circuit is connected to the third data line;
wherein the $(1-3)^{th}$ pixel circuit is connected to the fourth data line;
wherein the $(2-1)^{th}$ pixel circuit is connected to the first data line;
wherein the $(2-2)^{th}$ pixel circuit is connected to the second data line;
wherein the $(2-3)^{th}$ pixel circuit is connected to the third data line; and
wherein the $(2-4)^{th}$ pixel circuit is connected to the fourth data line.

* * * * *